United States Patent
Murata

(10) Patent No.: US 6,172,739 B1
(45) Date of Patent: Jan. 9, 2001

(54) EXPOSURE APPARATUS AND METHOD

(75) Inventor: Minoru Murata, Kanagawa-ken (JP)

(73) Assignee: Nikon Corporation, Tokyo (JP)

( * ) Notice: Under 35 U.S.C. 154(b), the term of this patent shall be extended for 0 days.

(21) Appl. No.: 09/195,902

(22) Filed: Nov. 19, 1998

Related U.S. Application Data

(63) Continuation of application No. 08/736,966, filed on Oct. 25, 1996.

(30) Foreign Application Priority Data

Nov. 10, 1995 (JP) .................................................. 7-292361

(51) Int. Cl.$^7$ ...................................................... G03B 27/42
(52) U.S. Cl. ................................................................ 355/53
(58) Field of Search ................................. 355/53, 63, 77, 355/50; 356/399; 430/322, 394, 396, 397; 438/946

(56) References Cited

U.S. PATENT DOCUMENTS

| | | | |
|---|---|---|---|
| 4,669,867 | 6/1987 | Uda et al. | 355/53 |
| 4,924,257 | 5/1990 | Jain | 355/53 |
| 5,050,111 | 9/1991 | Ayata et al. | 700/302 |
| 5,155,523 | 10/1992 | Hara et al. | 355/53 |
| 5,194,893 | 3/1993 | Nishi | 355/53 |
| 5,448,332 | 9/1995 | Sakakibara et al. | 355/53 |
| 5,477,304 | 12/1995 | Nishi | 355/53 |
| 5,699,145 | 12/1997 | Makinouchi et al. | 355/53 |
| 5,767,948 | 6/1998 | Loopstra et al. | 355/53 |
| 5,978,071 | * 11/1999 | Miyajima et al. | 355/53 |

FOREIGN PATENT DOCUMENTS

| | | |
|---|---|---|
| 6-132191 | 5/1994 | (JP) . |
| 6-349712 | 12/1994 | (JP) . |
| 7-135132 | 5/1995 | (JP) . |

* cited by examiner

Primary Examiner—Russell Adams
Assistant Examiner—Rodney Fuller
(74) Attorney, Agent, or Firm—Oliff & Berridge, PLC

(57) ABSTRACT

In order to improve the throughput of a scanning type of exposure system while maintaining the positioning precision, the positioning error range $\epsilon_S$ at the scan start position is set to be less strict than the positioning error range $\epsilon_E$ at the start of exposure. This reduces the settling time $T_S$ before acceleration from the scan start position toward the exposure start position can commence. Thus, upon finishing exposure of a current shot area, the substrate stage moves toward a target position, which is to be the scan start position. The velocity of the substrate stage reaches substantially zero at the scan start position. The substrate stage 17 slightly oscillates at the scan start position during positioning. When the differences between a target position and a detected position remain within an acceptable positioning error range $\epsilon_S$ (or tolerance) at the scan start position for a predetermined number of sampling values, acceleration toward the exposure area commences. The large positioning error that results from loosening of the positioning precision (or tolerance) is corrected between the scan start time and the exposure start time.

48 Claims, 3 Drawing Sheets

EXPOSURE APPARATUS AND METHOD

This is a Continuation of application Ser. No. 08/736,966 filed Oct. 25, 1996.

BACKGROUND OF THE INVENTION

1. Field of the Invention

The invention relates to an exposure method and apparatus for exposing patterns formed on a mask onto a photosensitive substrate during a photolithographic process for manufacturing, for example, semiconductor devices, liquid crystal displays, imaging devices (such as, for example, a CCD), or thin film magnetic heads. More particularly, the invention relates to an exposure method and apparatus for use in a so-called step-and-scan type exposure process, in which a mask pattern is successively exposed and transferred onto each shot area on a photosensitive substrate while simultaneously moving (scanning) the mask and the substrate in synchronization in predetermined scanning directions.

2. Description of Related Art

Conventionally, a batch exposure type projective exposure apparatus, such as a stepper, has been used to manufacture semiconductor elements or the like using a photolithographic technology. Such apparatus expose images of a pattern on a reticle used as a mask through a projective optical system and onto each shot area on a wafer (or a glass plate) on which photoresist or the like has been applied. Typically, these projective exposure apparatus have used a so-called step-and-repeat method in which the entire pattern from the reticle is exposed onto the wafer shot area (i.e., the area where one chip is formed) in one shot. The wafer is then stepped to the next position, and this process is repeated for the next shot area. This process is repeated until the requisite number of shot areas on the wafer have been exposed. This process typically is repeated many times, using different reticle patterns to build up the various circuits, for example, on the plurality of chips formed on the wafer.

Difficulties have arisen in using the step-and-repeat method due to the trend in the semiconductor industry to produce chips having larger sizes. Due to the larger size chips, the reticle patterns, and the resulting image that is exposed through the projective optical system, also has been made larger. This requires the exposure field of the projective optical system to be made larger, which causes the projective optical system to become more complicated in order to maintain aberrations within an allowable range throughout the entire exposure field. This increases the already high manufacturing cost and causes the projective optical system to become large, which results in the entire body of the apparatus becoming too large.

In order to respond to the demand for increasing the area of the transferred pattern without enlarging the exposure field of the projective optical system, a scanning exposure type of projective exposure apparatus using the so-called step-and-scan method has been developed. The step-and-scan method successively transfers and exposes patterns on a reticle onto each shot area on a wafer by scanning the reticle and the wafer synchronously with respect to the projective optical system so that, at any instant in time, a portion of the pattern of the reticle is projected onto the wafer through the projective optical system.

Semiconductor devices are manufactured by precisely layering a multitude of circuit layers on a wafer (i.e., the substrate). The projective exposure system is provided with stage mechanisms, including a reticle stage and a wafer stage, that move the reticle and the wafer, respectively, to predetermined positions (i.e. positioning), an alignment system, and a movable field stop (a movable blind). As the chips become highly integrated, each of the above mechanisms requires a more precise positioning ability. This typically requires additional time to be spent in order to improve the positioning accuracy. On the other hand, reducing the processing time is also highly desired in order to achieve a high throughput (i.e., a high productivity). Thus, a technique for improving both the positioning preciseness and the productivity is demanded.

In a typical projective exposure system, the reticle pattern is transferred onto a plurality of shot areas one at a time. The exposure system repeats a series of actions, which include moving a target shot area (i.e., the substrate) to be exposed to the vicinity of the exposure field (this is referred to as a stepping action), aligning the shot area to the reticle, and exposing the reticle pattern onto the shot area. In particular, the following series of steps are repeated in a projective exposure system of a scanning exposure (i.e., step-and-scan) type: stepping the wafer stage to the scan start position of the next shot area, accelerating the reticle stage and the wafer stage so as to reach a predetermined scan velocity at or before the exposure start position, adjusting the relative position between the reticle stage and the wafer stage with a high positioning accuracy (i.e., to within a very small tolerance), and driving the reticle stage and the wafer stage at predetermined scan velocities to carry out scanning exposure, while synchronously controlling other driving systems, such as, for example, the movable blind. In such a conventional system, the positioning preciseness (tolerance) at the scan start position and the positioning preciseness (tolerance) during scanning exposure were set to be at substantially the same level.

In the conventional step-and-repeat projective exposure system, the stepping action to the next shot area is by the shortest distance, which is a straight line, and is performed immediately after exposure of a current shot area is completed. Then, positioning (i.e., alignment of the shot area to the reticle) is performed with a high preciseness at the next shot area, and exposure is performed at that position.

On the other hand, in a scanning exposure type (i.e., step-and-scan) projective exposure system, when exposure of the current shot area is finished, the wafer stage steps to a scan start position for the next shot area while decreasing its velocity. The scan start position is spaced a distance from the next shot area so that the wafer stage can accelerate to the desired velocity before reaching the next shot area. After the wafer stage is precisely positioned at the scan start position, scanning exposure is carried out by, for example, reversing the scanning direction. Thus, in the scanning exposure type projective exposure system, after the next shot area of the wafer stage is transversely displaced from the center of exposure of the projective optical system, positioning is performed at the scan start position of the next shot area. For this reason, it is difficult for the scanning exposure type system to have a throughput that is as high as that for the step-and-repeat projective exposure system.

SUMMARY OF THE INVENTION

Therefore, the present invention aims to provide an exposure method and apparatus that can improve the throughput of a scanning exposure type (e.g., step-and-scan) exposure system while maintaining the positioning preciseness for exposure as accurately as before.

In the exposure method and apparatus of embodiments of the invention, each of a plurality of areas on a substrate is exposed with a pattern of a mask while synchronously scanning the mask and the substrate relative to exposure light. The positioning tolerance with regard to the scan start position of each of the shot areas is set to be less strict (i.e., larger) than the positioning tolerance of the exposure process (e.g., 5 to 200 times larger). This can reduce the time taken for positioning the substrate stage at the scan start position. Since the positioning tolerance at the exposure position is maintained as high (i.e., small) as before, throughput (productivity) is increased with a high exposure preciseness.

The positioning error at the scan start position of each of the shot areas on the substrate is preferably corrected between the scan start position and the exposure start position. Thus, the positioning error at the scan start position, which was generated by loosening the tolerance on the positioning precision, is corrected before reaching the exposure start position so as not to decrease the positioning precision during exposure.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

The invention will be described in conjunction with a preferred embodiment, in which the present invention is applied to a step-and-scan type projective exposure system. In the step-and-scan type projective exposure system, the reticle pattern is successively exposed and transferred onto each of a plurality of shot areas on the substrate (e.g., a wafer) by synchronously scanning the reticle and the substrate with respect to a projective optical system. For further details on projective exposure apparatus that use the step-and-scan method, see, for example, U.S. Pat. No. 5,477,304 and U.S. Pat. No. 4,924,257, both of which are incorporated herein by reference in their entireties. As indicated in the above patents, apparatus that use the step-and-scan method simultaneously move the reticle stage and the substrate stage in synchronism (although typically at different velocities (due to the reduction projective optical system preferably used) and in different (opposite) directions), while projecting light through the reticle and onto the substrate. The light forms an area (the illumination area) on the reticle and on the substrate. The illumination area can have a variety of shapes such as, for example, rectangular, arcuate or hexagonal.

Figure 1:
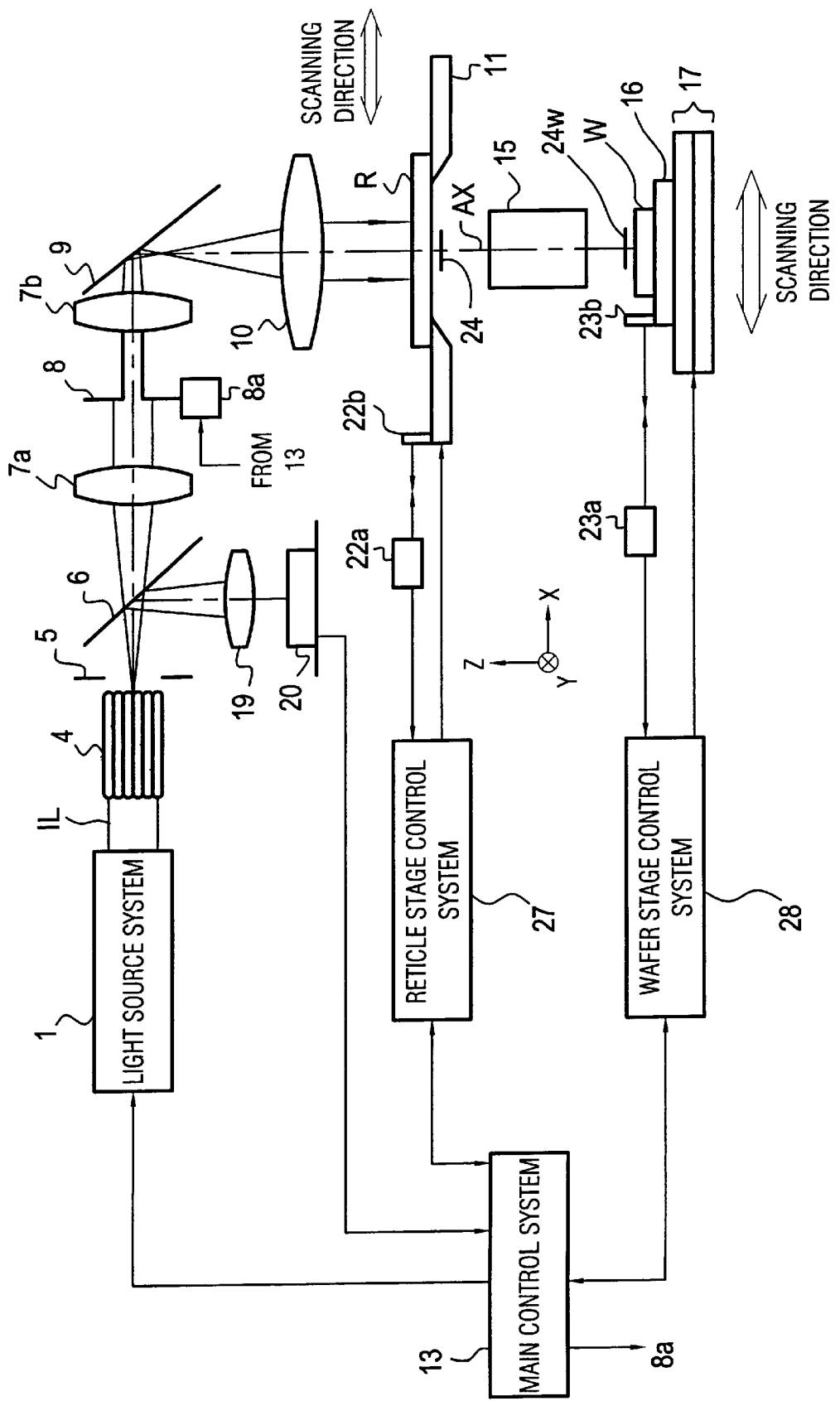
FIG. 1 is a schematic block diagram showing the overall structure of an embodiment of a projective exposure system according to the invention.

FIG. 1 shows an example of a projective exposure system according to an embodiment of the invention. Illumination light IL is emitted by a light source system 1, which can include a beam attenuator that adjusts the intensity of the light provided to the wafer W. The beam attenuator portion of the light source system 1 is a device through which the laser beam is transmitted, and can be used to control the intensity of the laser beam. For example, the beam attenuator typically includes a plurality of attenuating filters mounted on a turret or on a slide, which can be used to vary the intensity of the light output from the light source system 1. Thus, the beam attenuator can be used to vary (i.e., control) the intensity of the light output by light source system 1, maintaining the light intensity at desired levels. See, for example, U.S. patent application Ser. No. 08/260,398, filed Jun. 14, 1994, the disclosure of which is incorporated herein by reference in its entirety.

The illumination light IL enters the fly-eye lens 4. The light source system 1 is controlled by the main control system 13. More particularly, the main control system 13 controls the light source and the beam attenuator in the light source system 1 to adjust the intensity of the illumination light IL that is incident on the wafer W. Suitable examples of the illumination light IL include KrF excimer laser beam, ArF excimer laser beam, high frequency waves of a copper vapor laser and a YAG laser, and emission lines of the ultraviolet band of a super-high-pressure mercury-vapor lamp (g rays, i rays, etc.). The fly-eye lens 4 forms a multitude of secondary light sources to illuminate the reticle R with a uniform intensity distribution. An aperture stop 5 is positioned at the exit side of the fly-eye lens 4. The illumination light IL emitted from the secondary light source within the aperture stop 5 enters a beam splitter 6 having a reflective factor that is small and a transmissive factor that is large. The illumination light IL transmitted through the beam splitter 6 passes through the aperture of the movable field stop (hereinafter, referred to as a movable blind) 8 via a first relay lens 7A.

The movable blind 8 is positioned on the conjugate surface with regard to the pattern surface of the reticle R, and is structured so that the position and the scan direction width of a rectangular aperture of the movable blind 8 can be continuously changed by means of a blind driving system 8a. The blind driving system 8a is controlled by the main control system 13. Thus, the opening and closing movements of the movable blind 8 are controlled through the blind driving system 8a by commands from the main control system 13. By opening and closing the movable blind 8 through the blind controller 8a in response to commands from the main control system 13, the illuminating area of the illumination light IL that reaches the reticle R (and the wafer W) is continuously adjusted so that exposure of areas other than the desired shot area is prevented. Movement of blind 8 also varies the size of the illumination area so as to control the dose of exposure received by the substrate. See, for example, the above-incorporated U.S. patent application Ser. No. 08/260,398. Also see, for example, U.S. Pat. No. 5,194,893, the disclosure of which is incorporated herein by reference in its entirety. The illumination light that has passed the movable blind 8 passes through a second relay lens 7B, a mirror 9 for bending the light path, and a main condenser lens 10, so as to illuminate a slit-like illumination area 24 on the reticle R with uniform intensity distribution. The pattern within the illumination area 24 on the reticle R is reversed and reduced by the projective optical system 15 having a projection magnification β (β is, for example, ¼ or ⅕). The reversed and reduced image is projectionexposed onto a slit-like exposure area 24W on the wafer W (the wafer W can be, for example, a glass, quartz or semiconductive substrate).

The following explanation assumes that illumination area 24 is in the shape of a slit. A Z axis is, as shown in FIG. 1, the axis that is parallel to the optical axis of the projective optical system 15. A scanning direction of the reticle R with respect to the slit shaped illumination area 24 is referred to as the X direction and is in a plane perpendicular to the Z axis, as shown in FIG. 1. A non-scanning direction perpendicular to the scanning direction is referred to as the Y direction, and extends out of the page in FIG. 1.

The reticle R is mounted on a reticle stage 11 via a reticle holder (not shown). The reticle stage 11 moves very finely in two-dimensions in a plane perpendicular to the optical axis of the projective optical system 15 (i.e., the X-Y plane) to precisely position the reticle R. The reticle stage 11 is also movable in the scanning direction (i.e., the X-direction) at a predetermined scan velocity. The reticle stage 11 has a stroke that allows the entire surface of the reticle R to traverse at least the illumination area 24 in the scan direction. A moving mirror 22b reflects a laser beam from an external laser interferometer 22a and is fixed at the end in the reticle stage 11 (in the -X direction). The position of the reticle stage 11 is always monitored by the laser interferometer 22a. The position information of the reticle stage 11, obtained by the laser interferometer 22a, is supplied to the reticle stage control system 27, and further, to the main control system 13. Based on the position information, the main control system 13 controls the position and the velocity of the reticle stage 11 through the reticle stage control system 27.

The wafer W is mounted on a Z-tilt stage 16 via a wafer holder (not shown). The Z-tilt stage 16 is mounted on a substrate stage 17, which is driven in the X and Y directions through a substrate stage control system 28. The substrate stage 17 performs the step-and-scan action that repeats the scan-exposure action to each of the shot areas on the wafer W and the stepping action for stepping to the next exposure start position. Z-tilt stage 16 allows the wafer Z to move in the Z-direction and to tilt with respect to the X-Y plane.

A moving mirror 23b is fixed at an end of the Z-tilt stage 16, and reflects a laser beam from an external laser interferometer 23a. The position of the Z-tilt stage 16 (and, thus, the position of the wafer W) is continuously monitored by the laser interferometer 23a. The position information from the laser interferometer 23a regarding the Z-tilt stage 16 is supplied to the wafer stage control system 28, and further to the main control system 13 through the wafer stage control system 28. The main control system 13 controls the position and the velocity of the wafer W via the wafer stage control system 28, based on the position information.

In the present embodiment, the reticle R is scanned in the +X direction (or in the -X direction) at a velocity of $V_R$, while synchronously scanning the wafer W in the -X direction (or in the +X direction) at a velocity $V_W$. The ratio of the velocity $V_W$ to the velocity $V_R$ (i.e., $V_W/V_R$) is exactly the same as the magnification β of the projective exposure system 15, thereby precisely transferring the pattern formed on the reticle R onto each of the shot areas on the wafer W.

The illumination light reflected by the beam splitter 6 is received through a collective lens 19 at an integrator sensor 20, which consists of one or more photoelectric converting devices. The photoelectrically converted signal generated by the integrator sensor 20 is supplied to the main control system 13. The relationship between the photoelectrically converted signal from the integrator sensor 20 and the intensity of the illumination light at the exposure surface of the wafer W is determined in advance. (This is done because the various optical elements located between beam splitter 6 and wafer W affect the intensity of the light that reaches the wafer W. Thus, the intensity measured at integrator 20 is not the same as the intensity that actually exists at wafer W. Accordingly, prior to exposing a wafer, a measurement is taken of the intensity of light source system 1 provided to the wafer location and to the integrator 20 to establish the relationship between these two values.) Therefore, the exposure amount on the wafer W is controlled based on the photoelectrically converted signal.

Although not shown in FIG. 1, the system of FIG. 1 preferably includes an oblique incident type auto focus (AF) system that detects the surface position (i.e., in the Z direction) and the tilting angle of the wafer W, and a plurality of alignment sensors for positioning the reticle R and each of the shot areas on the wafer W. One preferred AF system is disclosed in U.S. Pat. No. 5,448,332, the disclosure of which is incorporated herein by reference in its entirety.

Next, an example of an exposure action will be described with reference to FIGS. 2 to 4. In the scan-exposure type of projective exposure system, the pattern formed on the reticle R is transferred onto each of the shot areas on the wafer W by maintaining precise synchronization among the respective stage systems and the other driven systems (such as, for example, the movable blind 8). Since scanning must be made at a constant velocity during the scanning exposure process, scanning exposure begins after the respective driving systems have been precisely synchronized at an exposure start position after passing through an acceleration period. In the present embodiment, the accuracy of the positioning of the substrate stage 17 at the scan start position is set to be less strict than at the exposure start position. Accordingly, the time required for the positioning to the scan start position is reduced, and throughput of the system is improved while maintaining a high exposure preciseness. This will be described in more detail, with an example of the action of the substrate stage 17.

Figure 2:
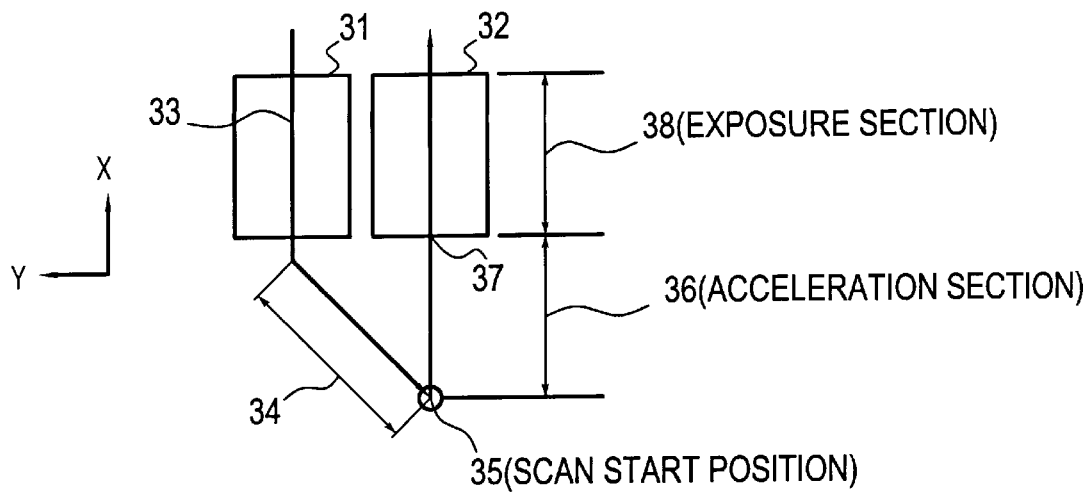
FIG. 2 is a plan view of a wafer and illustrates the moving path of the substrate stage relative to the projective optical system of the FIG. 1 exposure apparatus.

FIG. 2 shows the stepping and the scanning movement of the wafer W caused by the substrate stage 17 shown in FIG. 1. In actual operation, the projective optical system 15 is fixed, and the wafer W is driven. However, for simplifying the explanation, the following description is made assuming that the wafer W remains stationary, and that the optical axis AX of the projective optical system 15 moves along the line 33 in the direction indicated by the arrow. The optical axis AX of the projective optical system 15 scans a current shot area 31 along the line 33 in the X-direction. Then, the optical axis AX moves to the front of a next shot area 32 (i.e., to a position below the shot area 32 in FIG. 2) by moving through a stepping section 34 in a stepwise manner in accordance with the movement of the substrate stage 17. The position of the optical axis AX of projective optical system 15 is adjusted to the scan start position 35 of the next shot area 32 with a positioning precision that is less strict than the positioning precision at an exposure start position 37. Once the optical axis AX is positioned at scan start position 35, optical axis AX is accelerated within the acceleration section 36 and reaches a predetermined scanning velocity at or before the exposure start position 37. In the exposure section 38, the optical axis moves along the center of the next shot area 32 at the scanning velocity.

Figure 3:
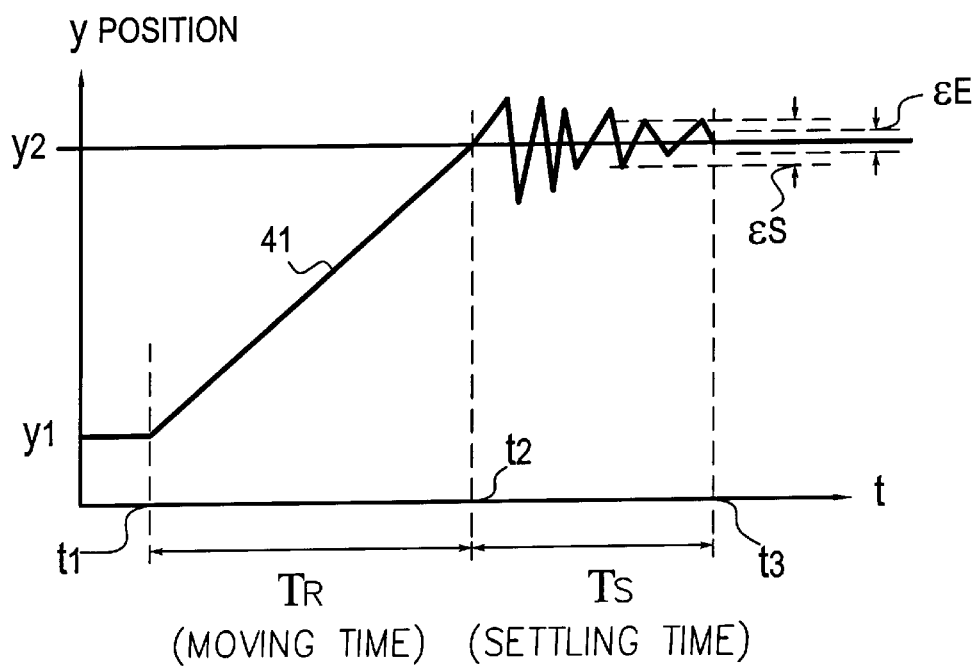
FIG. 3 is a chart showing the position and positioning oscillation of the FIG. 1 substrate stage.

FIG. 3 shows the positioning movement of the substrate stage 17 in accordance with a preferred embodiment of the invention. In this chart, the horizontal axis represents time t, and the vertical axis represents a "y" position along the subscanning direction (i.e., the Y-direction). As indicated by the sawtooth line 41, upon completing exposure of the current shot area 31 at time t1, the substrate stage 17 starts moving from the position y1 toward the next shot area 32. As the substrate stage 17 approaches the scan start position 35, the substrate stage 17 slows down so that its velocity reaches substantially zero (0) at time t2. At this time, the position y in the Y-direction starts oscillating in the vicinity of the target position y2 and converges, during the period of time between t2 and t3, toward the target position y2, which is to be the scan start position 35. The amplitude of the oscillation converges to substantially zero in the Y-direction at time t3. At this point in time, it is determined that the positioning has been completed. Then, acceleration of the substrate stage 17 toward the next shot area 32 begins at time t3. The "y" position of the substrate stage 17 is detected with a fixed sampling period. If the displacement of the "y" position from the target position y2 continuously resides within an acceptable positioning error range $\epsilon_S$ (i.e., if it is within $\pm\epsilon_S/2$) during a predetermined number of consecutive sampling times, it is determined that the positioning for the scan start position has been completed. In addition, the target position of the substrate stage 17 can be determined based on the relative position with the mask stage.

The time required for positioning the substrate stage 17 at the scan start position is expressed as the total time $T_T$ of the stepping time $T_R$ (between times t1 and t2) and the settling time $T_S$ (between times t2 and t3) (i.e., $T_T=T_R+T_S$). The settling time $T_S$ has a close relationship with the acceleration (or deceleration) ratio, the moving velocity of the substrate stage 17 during the movement, and the acceptable positioning error range. If the acceleration (or deceleration) ratio and velocity are large, the settling time $T_S$ becomes long. Also, the smaller the acceptable positioning error rage, the longer the time required to complete positioning. In other words, expanding the acceptable positioning error range results in a reduced positioning time.

Typically, the acceptable positioning error range used in the projective exposure system is several tens nm, which is suitable for the positioning precision at the exposure start position 37. The same precision is required throughout the scanning exposure process. However, in the scanning exposure system, strict positioning preciseness is actually required only during exposure (i.e., during scan exposure). Other types of positioning, especially the positioning at the scan start position 35, which is before exposure, do not require the same amount of preciseness as in the exposure process. The present invention takes advantage of this aspect of scanning exposure. The increased positioning error that results from loosening the conventional acceptable positioning error range (tolerance) is corrected during the acceleration and the synchronous control process between the scan start position 35 and the exposure start position 37. This is achieved by converging the error range to within the smaller acceptable error range $\epsilon_E$ at exposure.

As shown in FIG. 3, the acceptable positioning error range $\epsilon_S$ at the scan start position 35 is set to be larger than the acceptable positioning error range $\epsilon_E$ at the exposure start position 37. More particularly, assuming that the acceptable positioning error range $\epsilon_E$ at exposure is several tens nm, the acceptable positioning error range $E_S$ at the scan start position 35 is set to be several hundred nm to several $\mu$m. Thus, the positioning error range $\epsilon_S$ at the scan start position 35 is preferably set from ten to one hundred times the acceptable positioning error range $\epsilon_E$ at the exposure start position 37. For practical use, 5 to 200 times the acceptable error range $\epsilon_E$ is available as a positioning error range $\epsilon_S$ at the scan start position 35. If $\epsilon_S$ is smaller than 5 times $\epsilon_E$, improvement of the throughput is not effective. If $\epsilon_S$ exceeds 200 times $\epsilon_E$, it becomes difficult to correct the positioning error so as to be within the acceptable range $\epsilon_E$ before the optical axis reaches the exposure start position 37.

In setting the value of $\epsilon_S$, the acceleration velocity and/or the length of the acceleration section 36 between the scan start position 35 to the exposure start position 37 are taken into consideration so that the positioning error falls within the acceptable error range $\epsilon_E$ at some point within the acceleration section 36 (or at least by the exposure start position 37).

Figure 4:
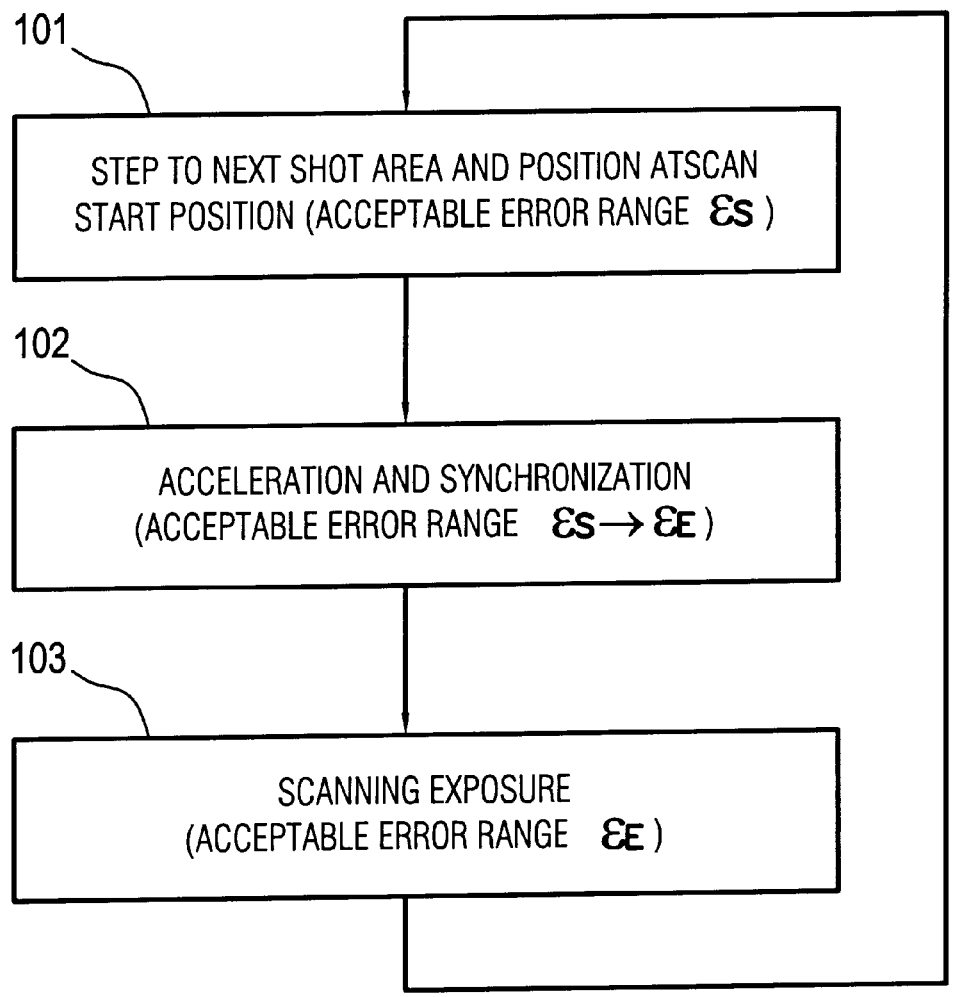
FIG. 4 is a flowchart showing an example of the step-and-scan exposure operation according to an embodiment of the invention.

FIG. 4 is a flowchart showing a portion of the projective exposure process of an embodiment of the invention. Steps 101 through 103 are repeated for every shot area on the wafer W. At step 101, the substrate stage 17 is driven to the next shot area (i.e., stepping is performed) and is positioned to the scan start position 35 with a positioning error range of $\epsilon_E$. Then, the substrate stage 17 is accelerated, while being synchronized with each of the driving systems by the main control system 13 at step 102. Scan exposure is performed at step 103 with a positioning error range of $\epsilon_E$. When the scan exposure is completed, the process returns to step 101, where stepping and positioning to the next shot area is carried out. These steps are repeated for a multitude of shot areas. The positioning error range $\epsilon_S$ at the scan start position 35 is set to be less strict than the positioning error range $\epsilon_E$ at the exposure start position 37. During the acceleration in step 102, the positioning precision is rapidly increased to bring the positioning error within the acceptable error range $\epsilon_E$ before (or upon) reaching the exposure start position 37. This ensures that the scan exposure is performed within a small positioning error range $\epsilon_E$ at step 103.

By setting the acceptable positioning error $\epsilon_s$, used in step 101, less strictly, the time taken for positioning the substrate stage 17 at the scan start position 35 is reduced. Since this action is performed for a multitude of shot areas, the total time taken for the overall scan exposure process is significantly reduced. The positioning precision at the exposure start position 37, and during scan exposure, is the same as with conventional systems, and thus throughput is significantly increased while maintaining the preciseness in exposure.

Although the invention has been described in conjunction with a specific embodiment, the invention is not limited to the stage system. The invention is also applicable to other driving systems that are synchronously controlled, such as, for example, the drive system for movable blind 8.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A scanning exposure apparatus in which each of a plurality of areas on a substrate is exposed to an image of a pattern of a mask while synchronously scanning the mask and the substrate relative to exposure light, comprising:

one or more movable mechanisms that move synchronously with a scanning movement of the mask and the substrate; and a control system that controls movement of the one or more movable mechanisms to a scan start position of one of the areas on the substrate with a first tolerance, and that controls movement of the one or more movable mechanisms so as to be positioned with a second tolerance that is smaller than the first tolerance as the one area on the substrate is exposed to the image of the pattern of the mask.

2. The apparatus of claim 1, wherein the control system also controls movement of the one or more movable mechanisms from the scan start position to an exposure start position at which exposure of the area to the image begins, the control system reducing a positioning error of the one or more movable mechanisms as the one or more movable mechanisms are moved from the scan start position to the exposure start position.

3. The apparatus of claim 1, wherein the first tolerance is 5–200 times greater than the second tolerance.

4. The apparatus of claim 1, wherein the one or more movable mechanisms include:
   a scanning system having a mask stage that moves the mask relative to light from a light source; and
   a substrate stage that moves the substrate relative to light from the light source.

5. The apparatus of claim 1, wherein the one or more movable mechanisms include a movable stop member.

6. A scanning exposure apparatus comprising:
   a scanning system that synchronously moves a mask and a substrate so as to expose each of plural areas on the substrate to an image of a pattern from the mask;
   a control system that controls movement of the scanning system for each of the areas from a scan start position toward an exposure start position, at which exposure of one of the areas on the substrate to the image is to begin, while changing a positioning tolerance of the scanning system from a first tolerance to a second tolerance that is smaller than the first tolerance.

7. A scanning exposure apparatus comprising:
   an illumination system located between a light source and a mask illuminated with light from the light source;
   a projective optical system located between the mask and a substrate, that projects an image of an illuminated pattern from the mask onto the substrate;
   a scanning system that synchronously moves the mask and the substrate so as to expose each of plural areas on the substrate to the image of the illuminated pattern; and
   a control system that controls movement of the illumination system and of the scanning system to a scan start position for each of the areas and that controls movement of the illumination system and of the scanning system to synchronously scan the mask and the substrate while projecting the illuminated pattern onto each of the areas on the substrate with exposure light from the light source, the control system positioning at least one of the illumination system and the scanning system at the scan start position with a first tolerance, and positioning the at least one of the illumination system and the scanning system with a second tolerance during projection of the illuminated pattern onto each of the areas on the substrate, the second tolerance being smaller than the first tolerance.

8. An exposure method for exposing each of a plurality of areas on a substrate to an image of a pattern of a mask while synchronously scanning the mask and the substrate relative to exposure light, comprising the steps of:
   positioning one or more movable mechanisms, which move synchronously with a scanning movement of the mask and the substrate, at a scan start position of one of the areas on the substrate within a first tolerance; and
   synchronously scanning the mask and the substrate while positioning the one or more movable mechanisms within a second tolerance that is smaller than the first tolerance so that the one area is exposed to the image of the pattern of the mask.

9. The method of claim 8, further comprising the step of:
   moving the one or more movable mechanisms from the scan start position to an exposure start position at which exposure of the area to the image of the pattern begins, and wherein a positioning error of the one or more movable mechanisms is reduced as the one or more movable mechanisms are moved from the scan start position to the exposure start position.

10. The method of claim 8, wherein the first tolerance is 5–200 times greater than the second tolerance.

11. The method of claim 8, further comprising the step of:
    repeating the step of positioning and the step of synchronously scanning for all of the plurality of areas on the substrate.

12. The method of claim 8, wherein the one or more movable mechanisms include:
    a scanning system having a mask stage that moves the mask relative to light from a light source; and
    a substrate stage that moves the substrate relative to light from the light source.

13. The method of claim 8, wherein the one or more movable mechanisms include a movable stop member.

14. The method of claim 8, wherein the first and second tolerances relate to a difference between an actual position of the one or more movable mechanisms and a target position of the one or more movable mechanisms.

15. The method of claim 14, wherein the first and second tolerances relate to a difference between an actual position of a substrate stage, which mounts the substrate, and a target position of said substrate stage.

16. The method of claim 15, wherein said target position is related to a position of a mask stage, which mounts the mask.

17. The method of claim 8, further comprising a step of changing the tolerance in the positioning of the one or more movable mechanisms from the first tolerance to the second tolerance.

18. The method of claim 8, wherein the relationship between said first tolerance and said second tolerance is set with consideration of at least one of the width between the scan start position and an exposure start position, and the moving acceleration of the one or more movable mechanisms.

19. The method of claim 8, wherein the one or more movable mechanisms are stopped at the scan start position.

20. The method of claim 8, wherein the one or more movable mechanisms begin acceleration at the scan start position.

21. The method of claim 20, wherein a positioning error of the one or more movable mechanisms is reduced during an acceleration movement of the one or more movable mechanisms.

22. An exposure method for exposing a substrate to an image of a pattern of a mask while synchronously scanning the mask and the substrate relative to exposure light, comprising the steps of:
    positioning the substrate at a scan start position with a first tolerance; and
    synchronously scanning the mask and the substrate while positioning the substrate with a second tolerance which is smaller than the first tolerance so that the substrate is exposed to the image of the pattern of the mask.

23. A method of controlling a scanning exposure apparatus that exposes each of a plurality of areas on a substrate to an image of a pattern of a mask while synchronously scanning the mask and the substrate relative to exposure light, comprising the steps of:

positioning one or more movable mechanisms of the scanning exposure apparatus, which move synchronously with scanning movement of the mask and the substrate, at a scan start position of one of the areas on the substrate with a first tolerance; and moving the one or more movable mechanisms from the scan start position toward an exposure start position, at which exposure of the area to the image of the pattern is to begin, while changing the positioning tolerance of the one or more movable mechanisms from the first tolerance to a second tolerance that is smaller than the first tolerance.

24. The method of claim 23, further comprising the step of:

synchronously scanning the mask and the substrate while projecting the portion of the pattern onto the area on the substrate with exposure light while positioning the one or more movable mechanisms with the second tolerance.

25. The method of claim 23, wherein the first tolerance is 5–200 times greater than the second tolerance.

26. The method of claim 23, further comprising the step of:

repeating the step of positioning and the step of moving for all the plurality of areas on the substrate.

27. The method of claim 23, wherein the one or more movable mechanisms include:

a scanning system having a mask stage that moves the mask relative to light from a light source; and a substrate stage that moves the substrate relative to light from the light source.

28. The method of claim 23, wherein the one or more movable mechanisms include a movable stop member.

29. The method of claim 23, wherein the one or more movable mechanisms are stopped at the scan start position.

30. The method of claim 23, wherein the one or more movable mechanisms begin acceleration at the scan start position.

31. The method of claim 30, wherein a positioning error of the one or more movable mechanisms is reduced during an acceleration movement of the one or more movable mechanisms.

32. An exposure method for exposing a substrate to an image of a pattern of a mask while synchronously scanning the mask and the substrate relative to exposure light, comprising the steps of:

positioning the substrate at a scan start position with a first tolerance; and moving the substrate from the scan start position toward an exposure start position, at which exposure of the substrate begins, while changing the positioning tolerance of the substrate from the first tolerance to a second tolerance that is smaller than the first tolerance.

33. A method for making a scanning exposure apparatus in which each of a plurality of areas on a substrate is exposed to an image of a pattern formed on a mask while synchronously scanning the mask and the substrate, the method comprising:

providing one or more movable mechanisms that move synchronously with a scanning movement of the mask and the substrate; and providing a control system, connected to the one or more movable mechanisms, that controls movement of the one or more movable mechanisms to a scan start position of one of the areas on the substrate with a first tolerance, and controls movement of the one or more movable mechanisms so as to be positioned with a second tolerance that is smaller than the first tolerance as the one area on the substrate is exposed to the image of the pattern.

34. The method of claim 33, wherein the control system also controls movement of the one or more movable mechanisms from the scan start position to an exposure start position at which exposure of the one area to the image begins, the control system reducing a positioning error of the one or more movable mechanisms during the movement of the one or more movable mechanisms from the scan start position to the exposure start position.

35. The method of claim 33, wherein the one or more movable mechanisms include a substrate stage that moves the substrate.

36. The method of claim 33, wherein the one or more movable mechanisms are stopped at the scan start position.

37. The method of claim 33 wherein the one or more movable mechanisms begin acceleration at the scan start position.

38. A method for making a scanning exposure apparatus, the method comprising:

providing a scanning system that synchronously moves a mask and a substrate so as to expose each of plural areas on the substrate to an image of a pattern formed on the mask; and providing a control system, connected to the scanning system, that controls movement of the scanning system for each of the areas from a scan start position toward an exposure start position, at which exposure of one of the areas on the substrate to the image is to begin, while changing a positioning tolerance of the scanning system from a first tolerance to a second tolerance that is smaller than the first tolerance.

39. The method of claim 28, wherein the scanning system includes a substrate stage that moves the substrate.

40. The method of claim 38, wherein the substrate is stopped at the scan start position.

41. The method of claim Wherein the substrate begins acceleration at the scan start position.

42. A method of controlling a scanning exposure apparatus in which a pattern of a mask is transferred onto a substrate by moving the mask and the substrate synchronously, the method comprising the steps of:

positioning one or more movable mechanisms of the scanning exposure apparatus, which move synchronously with the mask and the substrate, at a scan start position; and accelerating the one or more movable mechanisms from said scan start position while changing a positional tolerance of the one or more movable mechanisms.

43. The method of claim 42, wherein the one or more movable mechanisms include a mask stage that moves the mask relative to exposure light and a substrate stage that moves the substrate relative to the exposure light.

44. The method of claim 42, wherein the one or more movable mechanisms include a movable stop member.

45. The method of claim 42, wherein a positional error of the one or more movable mechanisms is reduced during an acceleration movement of the one or more movable mechanisms.

46. The method of claim 42, wherein the one or more movable mechanisms is positioned at the scan start position with one positional tolerance, and the one positional tolerance is changed to another positional tolerance that is smaller than the one positional tolerance during an acceleration movement of the one or more movable mechanisms.

47. The method of claim 46, wherein the one or more movable mechanisms are stopped at the scan start position.

48. The method of claim 47, wherein the one or more movable mechanisms begin the acceleration at the scan start position.

\* \* \* \* \*